United States Patent [19]

Ishida et al.

[11] 4,313,058
[45] Jan. 26, 1982

[54] LED LIGHT SOURCE DEVICE FOR A PULSE ENCODER

[75] Inventors: Hiroshi Ishida, Tokyo; Sunao Asahara, Hino, both of Japan

[73] Assignee: Fujitsu Fanuc Limited, Tokyo, Japan

[21] Appl. No.: 79,480

[22] Filed: Sep. 27, 1979

[30] Foreign Application Priority Data

Oct. 6, 1978 [JP] Japan .............................. 53-122730

[51] Int. Cl.³ .............................................. H01L 9/00
[52] U.S. Cl. ................................. 250/553; 250/231 SE
[58] Field of Search ................ 250/552, 553, 231 SE, 250/237 G, 221, 222, 578

[56] References Cited

U.S. PATENT DOCUMENTS

| | | | |
|---|---|---|---|
| 3,997,782 | 12/1976 | Willts | 250/231 SE |
| 4,063,227 | 12/1977 | Peterson | 250/552 |
| 4,179,629 | 12/1979 | Sahasrabudhe et al. | 250/552 |

*Primary Examiner*—David C. Nelms
*Attorney, Agent, or Firm*—Armstrong, Nikaido, Marmelstein & Kubovcik

[57] ABSTRACT

In an LED light source device for a pulse encoder, a plurality of LEDs are divided into a plurality of groups and each of said groups is included in one of the branches connected across the power source. At least one dummy LED or dummy diode is connected in series with the LED in a predetermined one of said branches, so that the voltage drop characteristics of said branches are equalized.

3 Claims, 4 Drawing Figures

LED LIGHT SOURCE DEVICE FOR A PULSE ENCODER

TECHNICAL FIELD

The present invention relates to an LED (Light Emitting Diode) light source device for a pulse encoder, more particularly, to an LED light source device in a system in which signals corresponding to light passing through a code plate of a pulse encoder are differentially amplified. This LED light source device for a pulse encoder may be used, for example, for controlling a motor driving a table or a tool of a machine tool.

BACKGROUND ART

The prior art LED light source device for a pulse encoder is illustrated in FIGS. 1, 2 and 3. A rotary code plate 1 for pulse encoder is schematically illustrated in FIG. 2. Among the codes of phases A, B and Z, the code of the phase A will now be explained. A sequence of light interrupting patterns "a" are formed by means of metal vapor deposition on the surface of the code plate 1, with a predetermined interval between the adjacent patterns. A sequence of light interrupting patterns "f" are formed by means of metal vapor deposition on a fixed plate 3 located beneath the sequence of the light interrupting patterns "a". The sequence of the light interrupting patterns "f" corresponds to the sequence of the light interrupting patterns "a".

LEDs 21, 22 and 23 are arranged against the patterns of the phases A, B and Z on the pattern plate 1 as illustrated in FIG. 1, at the positions 21, 22 and 23 illustrated in FIG. 2 by broken line circles.

In the phase A, for example, the light emitted by the LED 21 passes through a light transmitting portion between the light interrupting patterns "a" on the pattern plate 1, then, passes through a light transmitting portion between the light interrupting portions f on the fixed plate 3 and, finally, is received by photo cells 41 and 42. In the arrangements illustrated in FIG. 2, the light emitted by the LED at the position 21 above the pattern plate 1 and forwarded to the left-side portion of the pattern plate 1 is directed to the photo cell 41, while the light emitted by the LED at the position 21 above the pattern plate 1 and forwarded to the right-side portion of the pattern plate 1 is directed to the photo cell 42. FIG. 2 shows the status in which the above mentioned left-side light is able to pass through the pattern plate 1 and the fixed plate 3 because the light transmitting portion between the light interrupting pattern "a" of the pattern plate 1 coincides with the light transmitting portion between the light interrupting pattern "f" of the fixed plate 3; while the above mentioned right-side light is unable to pass through the fixed plate 3 because the light interrupting pattern "f" of the fixed plate 3 coincides with the light transmitting portion between the light interrupting pattern "a" of the pattern plate 1.

Accordingly, when the light signals are converted into electric signals by the photo cells 41 and 42, the right-side photo cell 42 produces an electric signal $\overline{P}$ which has a phase difference of 180° with regard to an electric signal P produced by the left-side photo cell 41. These electric signals P and $\overline{P}$ are applied to a differential amplifier which produces a desired output. In this differential amplification system, it is required that the amount of the left-side portion of the light emitted by the LEDs 21, 22 and 23, and directed to the photo cell 41, be the same as the amount of the right-side portion of the light emitted by the LEDs 21, 22 and 23, and directed to the photo cell 42.

The prior art circuit for supplying electric power to the LEDs is illustrated in FIG. 3. The LED 21, the LED 22 and a resistor $R_1$, connected in series in a branch k, are connected in parallel with the LED 23 and a resistor $R_2$, connected in series in a branch l. In this circuit, when a source voltage $+E$ varies, the rates of variations of the currents of the LED 21 and the LED 22 are different from the rate of variation of the current of the LED 23, and accordingly, the rates of variations of the lights of the LED 21 and the LED 22 are different from the rate of variation of the light of the LED 23. The reason for these differences can be explained as follows. It is assumed that the current of the branch k is $i_1$, the current of the branch l is $i_2$, the voltage drops across the LED 21, LED 22 and LED 23 are e, respectively, the current reductions of the LED 21 and LED 22 when the source voltage $+E$ drops $\Delta E$ are $\Delta i_1$, respectively, and the current reduction of the LED 23 when the source voltage $+E$ drops $\Delta E$ is $\Delta i_2$. The rates of variations of the currents $i_1$ and $i_2$ of the branches k and l are calculated, respectively, as follows.

$$i_1 = \frac{E - 2e}{R_1}$$

$$i_2 = \frac{E - e}{R_2}$$

$$i_1 - \Delta i_1 = \frac{E - \Delta E - 2e}{R_1} = \frac{E - 2e}{R_1} - \frac{\Delta E}{R_1}$$

$$i_2 - \Delta i_2 = \frac{E - \Delta E - e}{R_2} = \frac{E - e}{R_2} - \frac{\Delta E}{R_2}$$

$$\frac{\Delta i_1}{i_1} = \frac{\Delta E}{R_1} \bigg/ \frac{E - 2e}{R_1} = \frac{\Delta E}{E - 2e}$$

$$\frac{\Delta i_2}{i_2} = \frac{\Delta E}{R_2} \bigg/ \frac{E - e}{R_2} = \frac{\Delta E}{E - e}$$

Therefore, the rates of variations of the currents $i_1$ and $i_2$ of the branches k and l are different. Under the unavoidable condition that the amount of the left-side portion of the light emitted by the LEDs 21, 22 and 23 and directed to the photo cell 41 is different from the amount of the right-side portion of the light emitted by the LEDs 21, 22 and 23 and directed to the photo cell 42, the difference of the rate of variation of the light between the LEDs 21 and 22 and the LED 23 exerts an undesirable influence on the output signal of this pulse encoder obtained by means of the differential amplification of the outputs P and $\overline{P}$ of the photocells 41 and 42.

DISCLOSURE OF THE INVENTION

It is the principal object of the present invention to equalize the rates of variations of the currents of the LEDs and, thus, equalize the rates of variation of the lights emitted by the LEDs, and accordingly, provide LED light signals suitable for a pulse encoder.

The present invention is based on the idea of equalizing the voltage drop characteristics of the branches including portions of a plurality of LEDs by using a dummy LED or dummy diode connected in series with an LED in one of said branches.

DETAILED DESCRIPTION OF PREFERRED EMBODIMENTS

Figure 1:
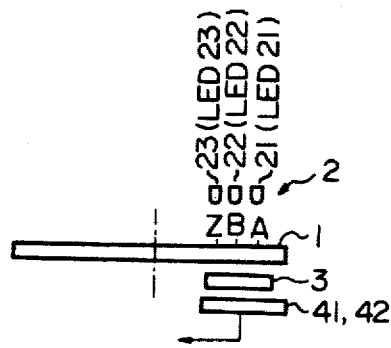
FIG. 1 is a sectional view of a fundamental arrangement of an LED light source device for a pulse encoder, taken along a line I—I in FIG. 2.
Figure 2:
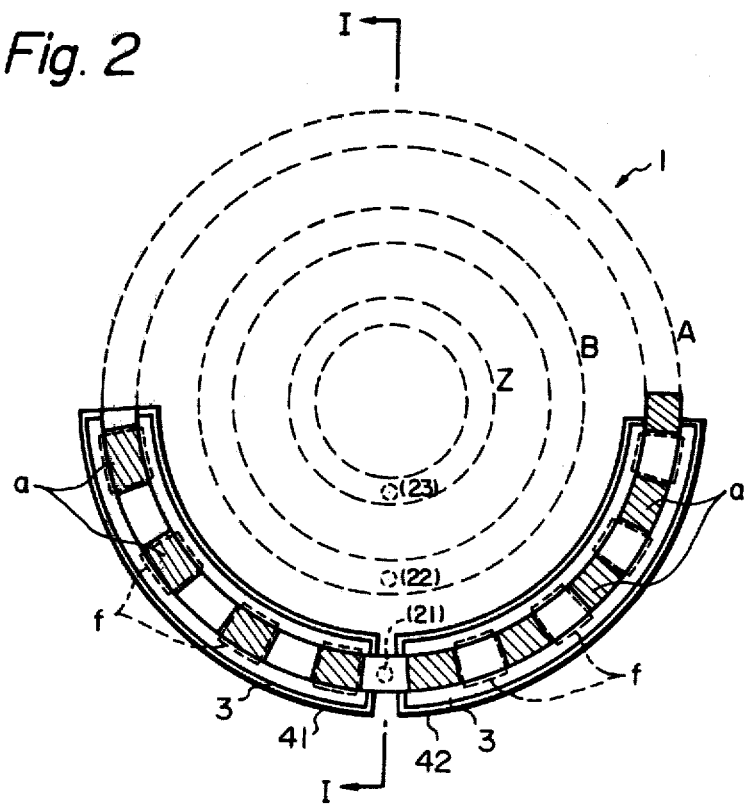
FIG. 2 is a plan view of the pulse encoder with which the LED light sources device illustrated in FIG. 1 is associated.
Figure 3:
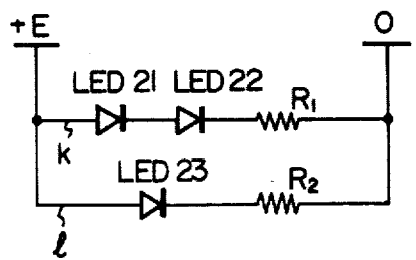
FIG. 3 illustrates a prior art power supply circuit for an LED light source device for a pulse encoder.
Figure 4:
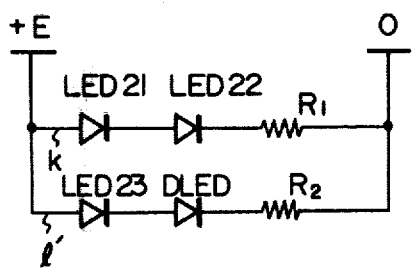
FIG. 4 illustrates a power supply circuit for an LED light source device for a pulse encoder in accordance with the present invention.

A power supply circuit for an LED light source device for a pulse encoder, as an embodiment of the present invention, is illustrated in FIG. 4. The structure of the pulse encoder with which light sources LED 21, LED 22 and LED 23 are associated is the same as the structure illustrated in FIGS. 1 and 2.

The LED 21, the LED 22 and the resistor $R_1$, connected in series in the branch k, are connected in parallel with the LED 23, a dummy Light Emitting Diode (DLED) and the resistor $R_2$, connected in series in a branch l'. The DLED is required to have the same voltage drop characteristic in the forward direction with reference to the value of the current and the temperature as each of the LEDs 21, 22 and 23 has. It is possible to use an ordinary diode in place of the Light Emitting Diode as the DLED.

In accordance with the circuit illustrated in FIG. 4, when the source voltage $+E$ varies, the rates of variations of the currents of the LED 21 and the LED 22 are the same as the rate of variation of the current of the LED 23, and accordingly, the rates of variations of the lights of the LED 21 and the LED 22 are the same as the rate of variation of the light of the LED 23. This relationship can be explained by the calculation set forth below. It is assumed that the voltage drop of the DLED is e, which is the same as the voltage drop of each of the LEDs 21, 22 and 23:

$$i_1 = \frac{E - 2e}{R_1}$$

$$i_2 = \frac{E - 2e}{R_2}$$

-continued $$i_1 - \Delta i_1 = \frac{E - \Delta E - 2e}{R_1} = \frac{E - 2e}{R_1} - \frac{\Delta E}{R_1}$$

$$i_2 - \Delta i_2 = \frac{E - \Delta E - 2e}{R_2} = \frac{E - 2e}{R_2} - \frac{\Delta E}{R_2}$$

$$\frac{\Delta i_1}{i_1} = \frac{\Delta E}{R_1} \bigg/ \frac{E - 2e}{R_1} = \frac{\Delta E}{E - 2e}$$

$$\frac{\Delta i_2}{i_2} = \frac{\Delta E}{R_2} \bigg/ \frac{E - 2e}{R_2} = \frac{\Delta E}{E - 2e}$$

Accordingly, the ratios $$\frac{\Delta i_1}{i_1} \text{ and } \frac{\Delta i_2}{i_2}$$

are the same. This prevents the undesirable influence on the output signal of the pulse encoder resulting from the differential amplification of the outputs of the photo cells 41 and 42 (FIGS. 1 and 2), even when the amount of the left-side portion of the light emitted by the LEDs 21, 22 and 23, and directed to the photo cell 41, is different from the amount of the right-side portion of the light emitted by the LEDs 21, 22 and 23, and directed to the photo cell 42.

What is claimed is:

1. An LED light source device for a pulse encoder in which the light emitted by a first, a second and a third LED passes through a pattern plate having light interrupting patterns and a fixed plate having light interrupting patterns and is received by a plurality of corresponding photo cells, said pulse encoder having a plurality of code units, each of said code units having one of said LED's, a portion of said pattern plate, a portion of fixed plate and two of said photo cells, wherein said first LED, said second LED and a first resistor are connected in series to form a first branch circuit, said third LED, a second resistor and a dummy means are connected in series to form a second branch circuit, said first and second branch circuits being connected in parallel across a voltage source, whereby changes in the light characteristics of said first, second and third LEDs are equalized.

2. An LED light source device as set forth in claim 1 wherein said dummy means is a fourth LED.

3. An LED light source device as set forth in claim 1 wherein said dummy means is a diode.

* * * * *